United States Patent
Huang et al.

[11] Patent Number: 6,133,089
[45] Date of Patent: Oct. 17, 2000

[54] METHOD FOR FABRICATING A DRAM CAPACITOR

[75] Inventors: Tse Yao Huang, Taipei; Shih-Chi Hsu, Chung-Li; Yinan Chen; Hsing-Chuan Tsai, both of Taipei, all of Taiwan

[73] Assignee: Nanya Technology Corporation, Taiwan

[21] Appl. No.: 09/314,201

[22] Filed: May 19, 1999

[30] Foreign Application Priority Data

Dec. 24, 1998 [TW] Taiwan ................................. 87121672

[51] Int. Cl.$^7$ ................................................ H01L 21/8242
[52] U.S. Cl. ............................................ 438/254; 438/397
[58] Field of Search ................................. 438/253–256, 438/393–399

[56] References Cited

U.S. PATENT DOCUMENTS 5,716,884 2/1998 Hsue et al. ............................ 438/254
5,926,719 7/1999 Sung ..................................... 438/396

*Primary Examiner*—Jey Tsai
*Attorney, Agent, or Firm*—George T. Marcou; Kilpatrick Stockton LLP

[57] ABSTRACT

A method for fabricating a DRAM capacitor is described. First, a semiconductor substrate having a capacitor contact is provided. Next, a first polysilicon layer is formed. Then, an oxide layer and a silicon oxy-nitride layer are sequentially formed over the first polysilicon layer. Next, the silicon oxy-nitride layer, the oxide layer, and the first polysilicon layer are selectively etched to leave a rectangular stack layer. Afterwards, the oxide layer and the first polysilicon layer of the rectangular stack layer are etched from the sidewall direction to leave a double T-shaped stack layer. Then, second polysilicon layer is formed on the upper surface and the sidewall of the double T-shaped stack layer. Next, the second polysilicon layer is selectively removed. The remaining second and first polysilicon layer are used as the bottom electrode. Afterwards, a dielectric layer and an upper electrode are formed on the bottom electrode.

15 Claims, 7 Drawing Sheets

METHOD FOR FABRICATING A DRAM CAPACITOR

BACKGROUND OF THE INVENTION

1. Field of the Invention

The present invention relates to a method for fabricating a memory device, and more particularly to a method for fabricating a crown capacitor for a dynamic random access memory (DRAM).

2. Description of the Prior Art

As semiconductor device dimensions get smaller and device density increases, it becomes more and more difficult to provide a capacitor having high capacitance. Recently, a DRAM which has a three-dimensional stack layered capacitor has been developed to increase the capacitance of the capacitor. Referring to FIGS. 1A through 1D, the cross-sectional side views of a conventional method for fabricating a capacitor's bottom electrode are depicted in sequence.

Referring now to FIG. 1A, a cross-sectional view of the first step is schematically shown. In FIG. 1A, an insulated layer 14 is formed on the p-type semiconductor substrate 10 having n-type source 12. The capacitor contact (CC) 16 and conductive plug 18 filled into the capacitor contact 16 are formed in the insulated layer 14 to connect with source 12. Then, a conductive polysilicon layer 20 and BPSG layer 22 are formed on the insulated layer 14. A photo-resist pattern 24 is coated on the BPSG layer 22 by a conventional photolithography process.

Next, as shown in FIGS. 1A and 1B, using the photo-resist pattern 24 as the etching mask, the BPSG layer 22 and polysilicon layer 20 are sequentially etched by anisotropic etching, thereby leaving a block which consists of the BPSG layer 22a and polysilicon layer 20.

Then, as shown in FIG. 1C, a conductive polysilicon layer 26 is formed on the surface of the block described above by low-pressure chemical vapor deposition.

Referring now to FIGS. 1C and 1D, the polysilicon layer 26 formed on the upper surface of the BPSG 22a is removed to leave polysilicon layer 26a. Afterward, BPSG 22a is removed by hydrogen fluoride solution, thereby forming the crown bottom electrode, polysilicon layer 26a and polysilicon layer 20 of the capacitor.

However, the conventional fabrication process for the bottom electrode of the capacitor suffers from problems. For example, the interface of polysilicon layer 20 and polysilicon layer 26a can produce native oxide in the thermal step. As a result, the polysilicon silicon layer 26a is easily stripped during the BPSG 22a removal step.

SUMMARY OF THE INVENTION

In view of the above disadvantages, an object of the invention is to provide a method for fabricating a DRAM capacitor, thereby avoiding the stripping problem of the conventional process.

The above object is attained by providing a method for fabricating a DRAM capacitor, comprising the steps of: (a) providing a semiconductor substrate having a capacitor contact; (b) forming a first polysilicon layer connecting said capacitor contact; (c) sequentially forming an oxide layer and a silicon oxy-nitride layer over said first polysilicon layer; (d) selectively etching said silicon oxy-nitride layer, said oxide layer, and said first polysilicon layer to leave a rectangular stack layer consisting of said silicon oxy-nitride layer, said oxide layer, and said first polysilicon layer, wherein said rectangular stack layer connects with said capacitor contact; (e) etching said oxide layer and said first polysilicon layer of said rectangular stack layer from the sidewall direction to leave a double T-shaped stack layer; (f) forming a second polysilicon layer on the upper surface and the sidewall of said double T-shaped stack layer; (g) anisotropically etching said second polysilicon layer to remove the upper surface and sidewall of said silicon oxy-nitride layer of said double T-shaped stack layer; (h) removing said silicon oxy-nitride layer and said oxide layer of said double T-shaped stack layer to expose said second and first polysilicon layers to be used as the bottom electrode of capacitor; and (i) forming a dielectric layer and an upper electrode over said bottom electrode to form a capacitor.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

The preferred embodiment of the invention is illustrated in FIGS. 2A through 2G of the drawings.

Figure 1A:
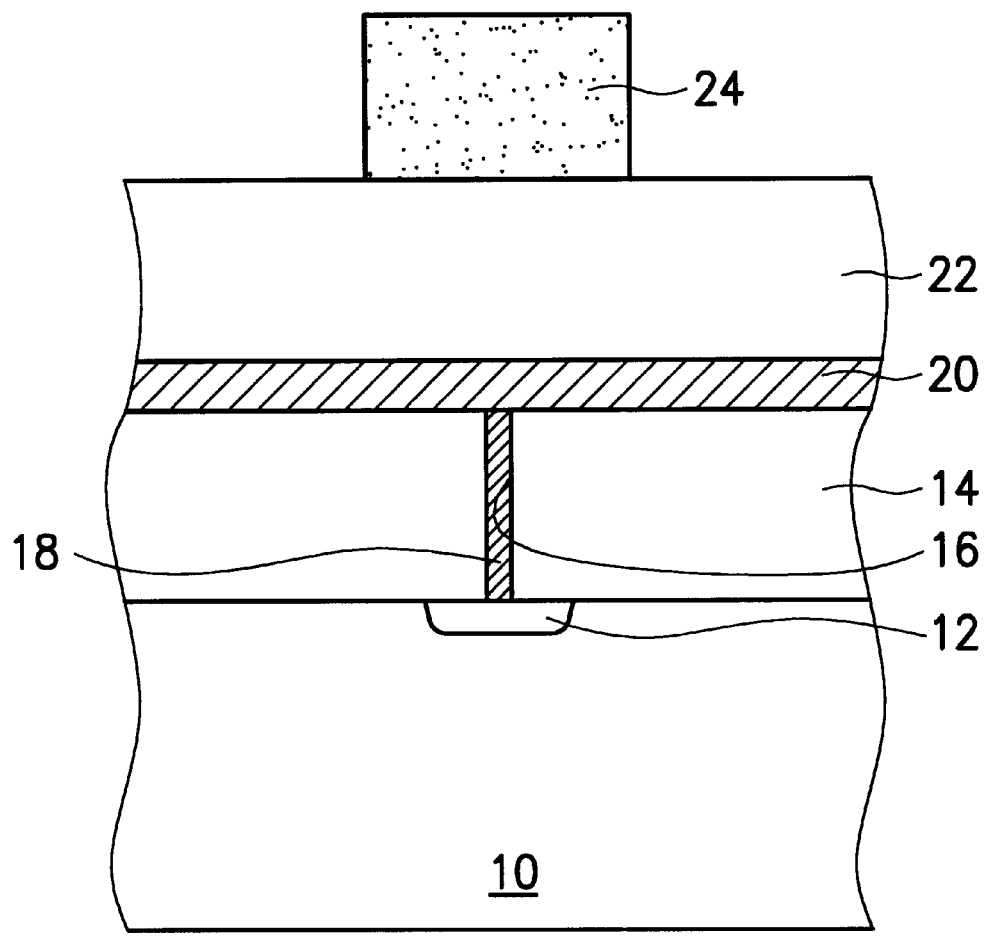
FIGS. 1A through 1D are cross-sectional side views showing the conventional manufacturing steps of the bottom electrode of DRAM crown capacitor.
Figure 1B:
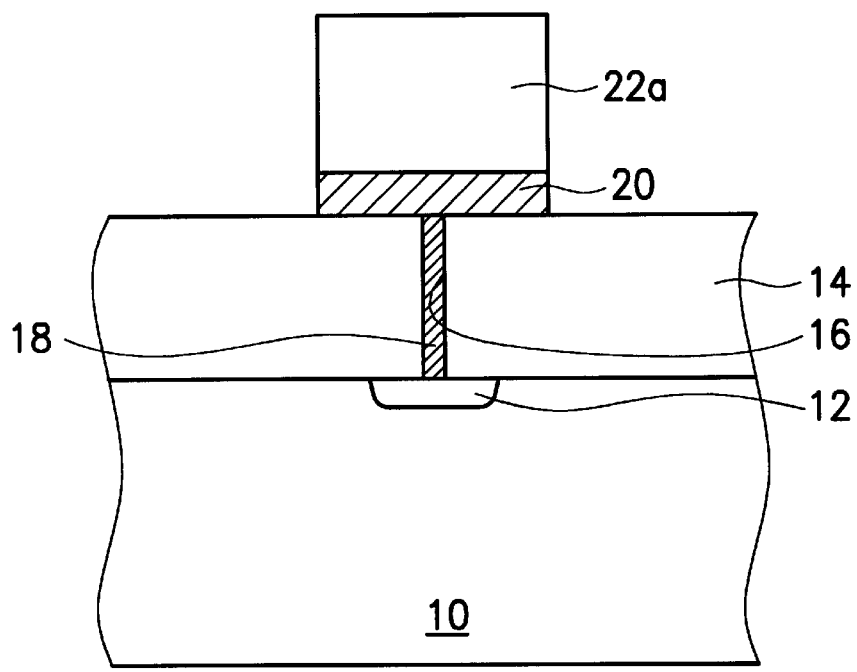
Figure 1C:
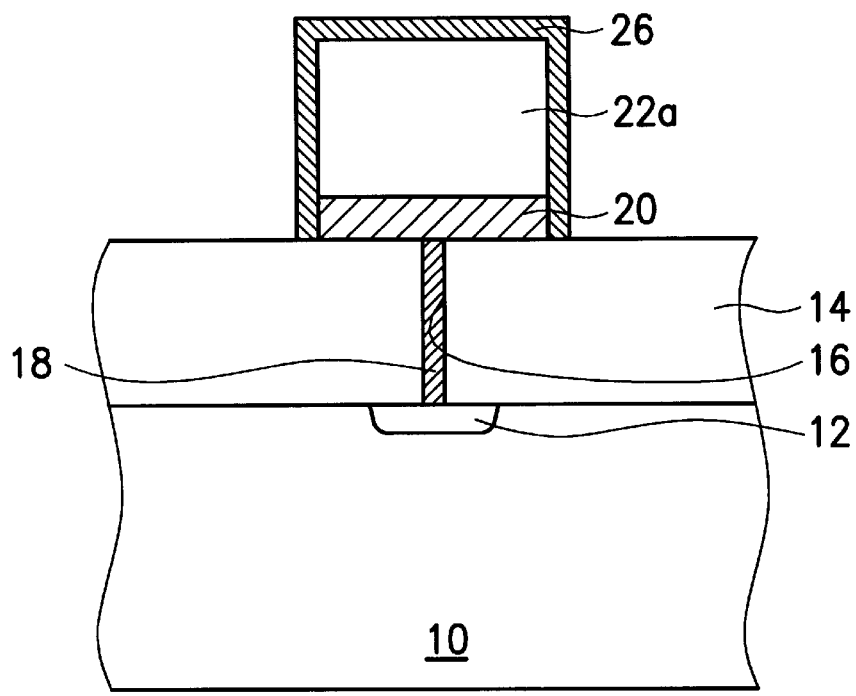
Figure 1D:
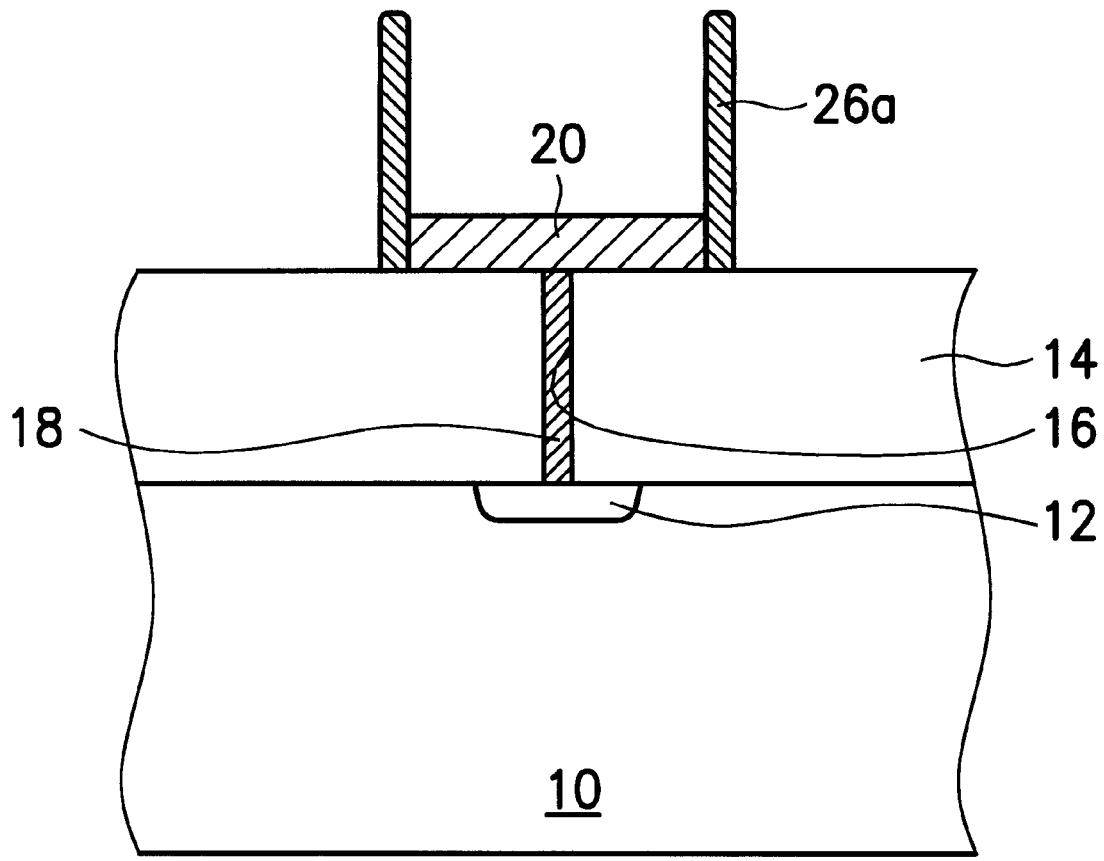
Figure 2A:
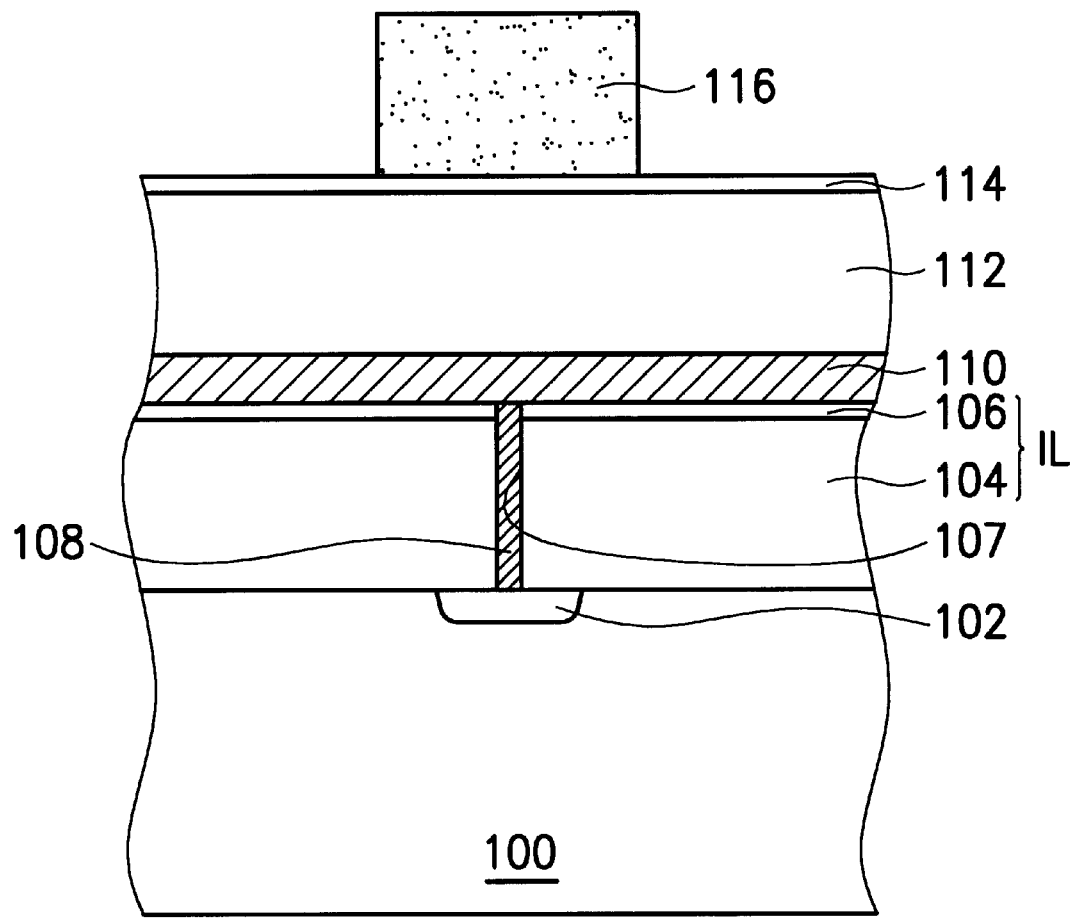
FIGS. 2A through 2G are cross-sectional side views showing the manufacturing steps of a DRAM crown capacitor of the invention.

Referring now to FIG. 2A, a cross-sectional view of the first step is schematically shown. In FIG. 2A, an insulated layer IL, consisting for example of silicon oxide layer 104 and silicon nitride layer 106, is formed on the p-type semiconductor (Si) substrate 100 having n-type source/drain 102 formed by As or P ion doping. The capacitor contact 107 and conductive plug 108 filled into the capacitor contact 107 are formed in the insulated layer IL to connect with source/drain 102. The gate electrode (word line) and bit line contact (not shown) are formed on the semiconductor substrate 100.

Then, a first polysilicon layer 110 having a thickness of approximately 1400 to 1600 Angstroms is formed on the insulated layer IL by using in-situ doped low pressure chemical vapor deposition (in-situ LPCVD), which preferably uses $SiH_4$ as the reactive gas. Afterward, a borophosphosilicate glass (BPSG) layer 112, having a thickness of approximately 6000 to 8000 Angstroms, is formed by atmosphere pressure chemical vapor deposition (APCVD), which preferably uses tetra-ethyl-orthosilicate (TEOS), $O_3/O_2$, triethyl borate (TEB), and trimethyl phosphate (TMP) as the reactive gas. Then, a silicon oxy-nitride layer 114, having a thickness of approximately 500 to 700 angstroms, is formed on the surface of the BPSG layer 112 by LPCVD using $SiH_4$, $N_2O$, and $N_2$ as the reactive gas.

Then, a photo-resist pattern 116 having a thickness of about 6000 Angstroms is coated by conventional photolithography process.

Figure 2B:
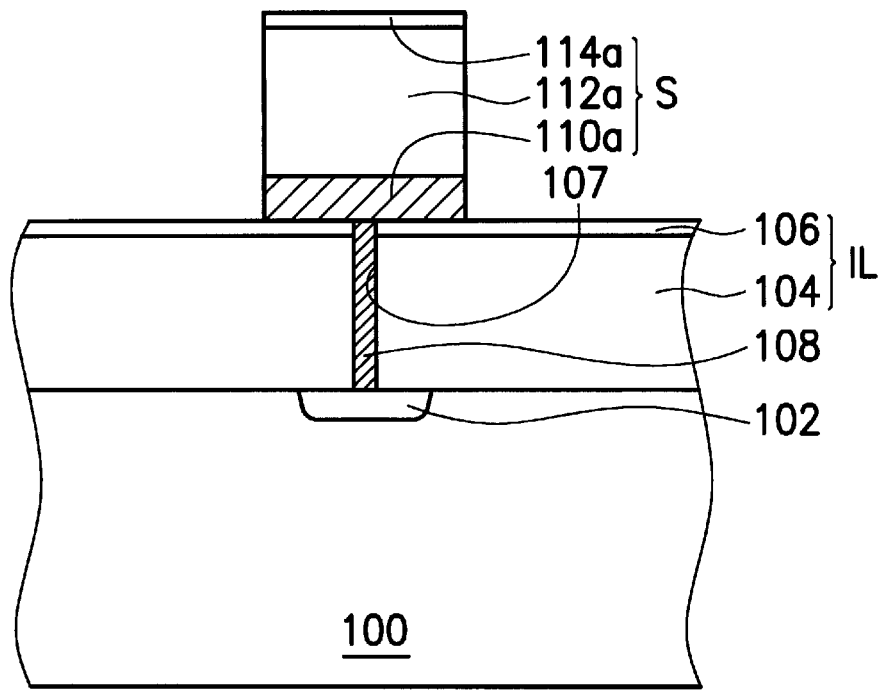

Next, as shown in FIGS. 2A and 2B, the silicon oxy-nitride layer 114, the BPSG 116, and the first polysilicon layer 110 are sequentially etched using the photo-resist pattern 116 as the etching mask, thereby leaving a rectangular stack layer S consisting of the silicon oxy-nitride layer 114a, the BPSG 116a, and the first polysilicon layer 110a. The etching step is applied by anisotropic reactive ion etching (RIE) using $CH_3F$ as the main reactive gas.

Figure 2C:
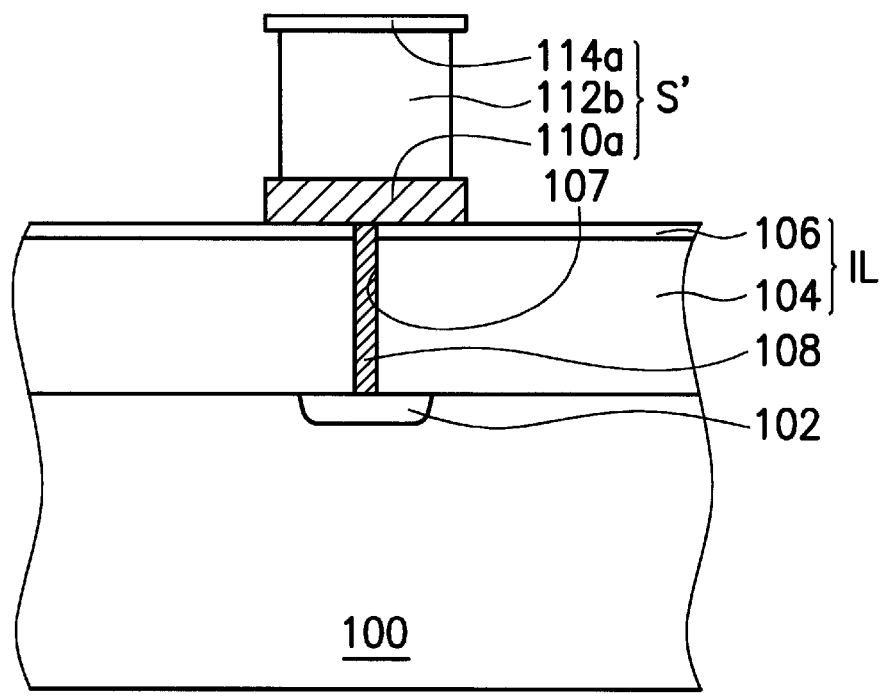

Then, as shown in FIGS. 2B and 2C, the sidewall of BPSG 112a is etched to leave BPSG 112b, preferably by diluted hydrogen fluoride solution, thereby forming a stack layer S'.

Figure 2D:
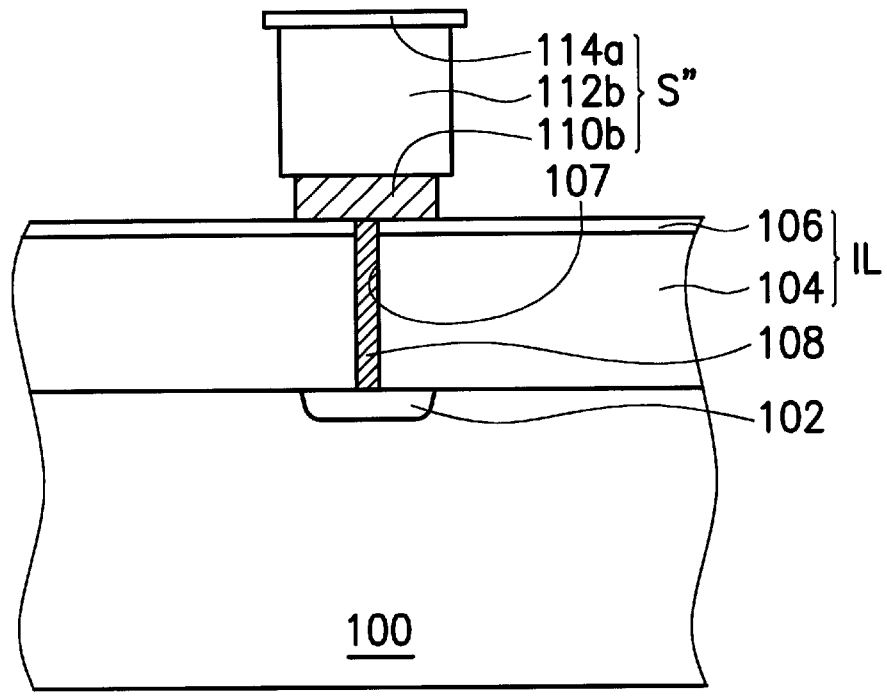

Referring now to FIGS. 2C and 2D, the first polysilicon layer 110a is etched to leave the first polysilicon layer 110b, preferably by dry etching using a gas containing Cl and F, thereby forming a double T-shaped stack layer S". The area of the silicon oxy-nitride layer 114a is larger than that of BPSG 112a. Moreover, the area of BPSG 112a is larger than that of the first polysilicon layer 110b.

Figure 2E:
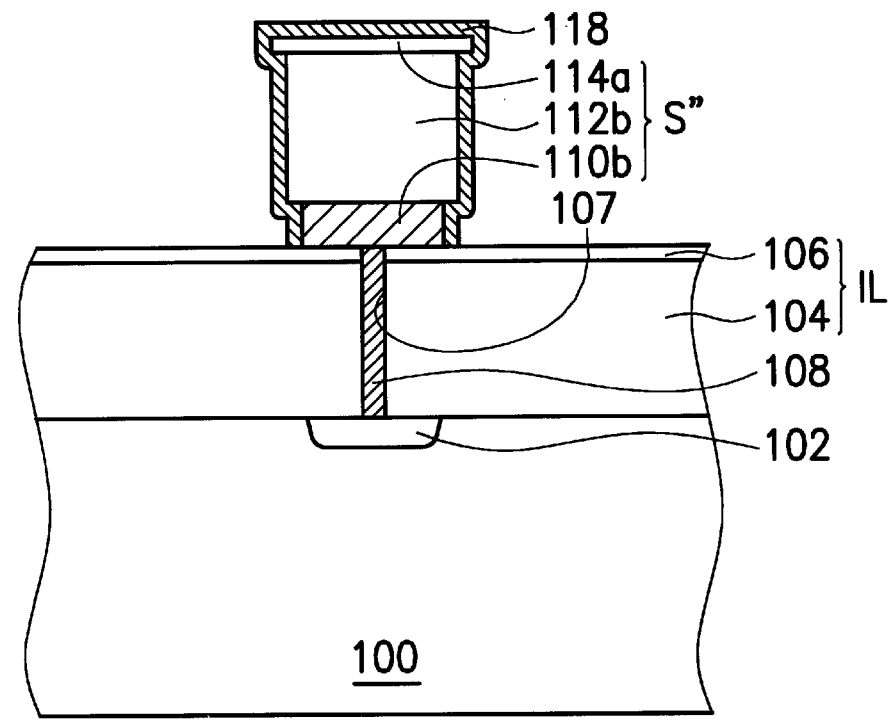
Figure 2F:
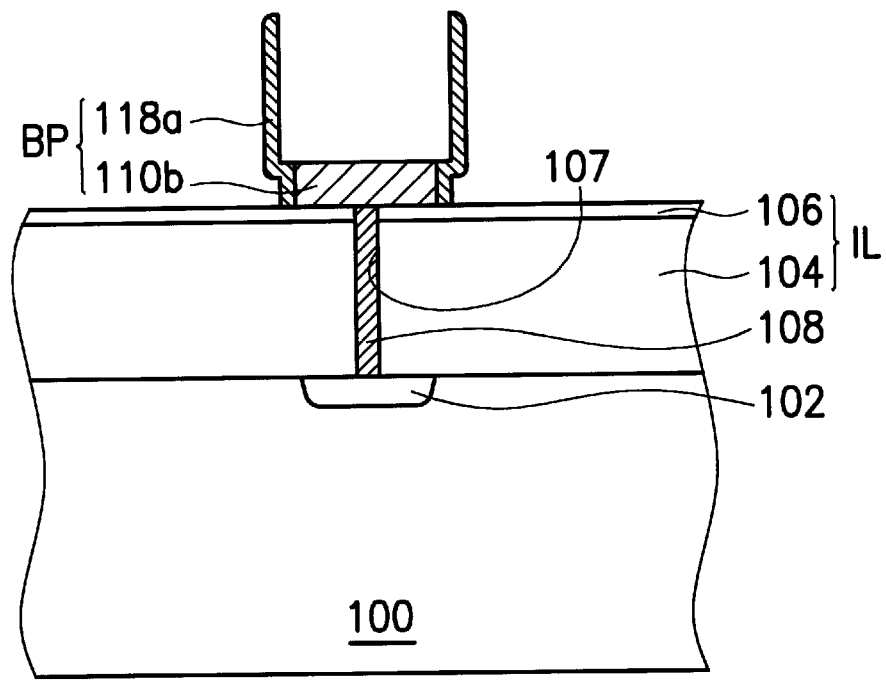

Referring now to FIG. 2E, a second polysilicon layer 118 having a thickness of approximately 500 to 1100 Angstroms is formed on the double T-shaped stack layer S" by using in-situ doped LPCVD, preferably using $SiH_4$ as the reactive gas. Next, using the silicon oxy-nitride layer 114a as the mask layer, the second polysilicon layer 118 formed the upper surface and the sidewall of the silicon oxy-nitride 114a is removed to leave the second polysilicon layer 118a, as shown in FIGS. 2E and 2F. Then, the silicon oxy-nitride layer 114a and the BPSG 112b are removed by a wet etching step using hydrogen fluoride solution as the etchant, thereby forming a crown bottom electrode BP consisting of the second polysilicon layer 118a and the first polysilicon layer 110b.

Figure 2G:
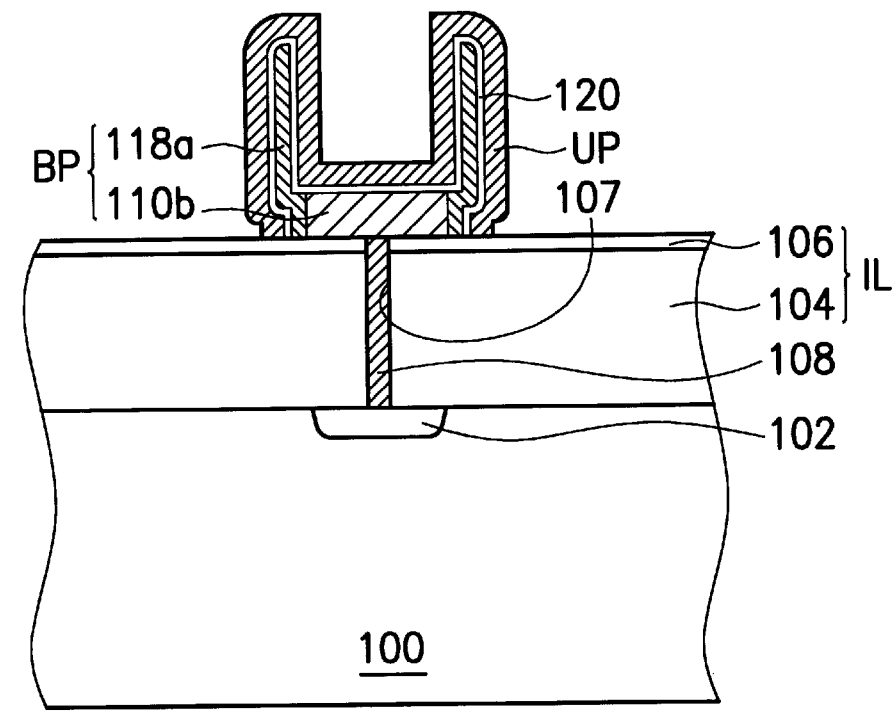

Afterwards, referring to FIG. 2G, a dielectric layer 120, for example oxide/nitride/oxide (ONO) or $Ta_2O_5$, is formed on the surface of bottom electrode BP by using chemical vapor deposition (CVD). Then, an upper electrode UP, preferably doped polysilicon layer, is formed on the dielectric layer 120 thereby forming a DRAM capacitor consisting of upper electrode UP, dielectric layer 120, and bottom electrode BP.

The first polysilicon layer 110b and second polysilicon 126a have a sealed interface (as shown in FIG. 2F) which can avoid encroachment by hydrogen fluoride solution during the step of removing the BPSG layer 112b. Therefore, the polysilicon layer stripping problem of the prior art is eliminated.

Due to the structure of double t-shaped stack layer s", the bottom electrode of the crown capacitor can be shrunk.

What is claimed is:

1. A method for fabricating a DRAM capacitor, comprising the steps of:
   (a) providing a semiconductor substrate having a capacitor contact;
   (b) forming a first polysilicon layer connecting said capacitor contact;
   (c) sequentially forming an oxide layer and a silicon oxy-nitride layer over said first polysilicon layer;
   (d) selectively etching said silicon oxy-nitride layer, said oxide layer, and said first polysilicon layer to leave a rectangular stack layer consisting of said silicon oxy-nitride layer, said oxide layer, and said first polysilicon layer, wherein said rectangular stack layer connects with said capacitor contact;
   (e) etching said oxide layer and said first polysilicon layer of said rectangular stack layer from the sidewall direction to leave a double T-shaped stack layer;
   (f) forming a second polysilicon layer on the upper surface and the sidewall of said double T-shaped stack layer;
   (g) anisotropically etching said second polysilicon layer to remove that portion formed on the upper surface and sidewall of said silicon oxy-nitride layer of said double T-shaped stack layer;
   (h) removing said silicon oxy-nitride layer and said oxide layer of said double T-shaped stack layer to expose said second and first polysilicon layers to be used as the bottom electrode of capacitor; and
   (i) forming a dielectric layer and an upper electrode over said bottom electrode to form a capacitor.

2. A method for fabricating a capacitor as claimed in claim 1, wherein said oxide layer in step (c) is a borophosphosilicate glass (BPSG) layer formed by CVD.

3. A method for fabricating a capacitor as claimed in claim 1, wherein step (h) is accomplished by hydrogen fluoride.

4. A method for fabricating a capacitor as claimed in claim 1, wherein said first and second polysilicon layers are doped polysilicon layer.

5. A method for fabricating a capacitor as claimed in claim 1, wherein said first polysilicon layer has a thickness of somewhere between 1400 and 1600 Angstroms.

6. A method for fabricating a capacitor as claimed in claim 5, wherein said oxide layer has a thickness of somewhere between 6000 and 8000 Angstroms.

7. A method for fabricating a capacitor as claimed in claim 6, wherein said silicon oxy-nitride layer has a thickness of somewhere between 500 and 700 Angstroms.

8. A method for fabricating a capacitor as claimed in claim 7, wherein said second polysilicon layer has a thickness of somewhere between 500 and 1100 Angstroms.

9. A method for fabricating a capacitor as claimed in claim 1, wherein said semiconductor substrate is a p-type silicon substrate.

10. A method for fabricating a capacitor as claimed in claim 9, wherein said capacitor contact connects to an n-type source/drain of a transistor.

11. A method for fabricating a DRAM capacitor, comprising the steps of:
   (a) providing a p-type semiconductor substrate which has an insulated layer thereon, said insulated layer having a capacitor contact connected to a n-type source/drain of transistor;
   (b) forming a first doped polysilicon layer connecting said capacitor contact;
   (c) sequentially forming a BPSG layer and a silicon oxy-nitride layer over said first doped polysilicon layer;
   (d) selectively etching said silicon oxy-nitride layer, said BPSG layer, and said first doped polysilicon layer to leave a rectangular stack layer consisting of said silicon oxy-nitride layer, said BPSG layer, and said first doped polysilicon layer, wherein said rectangular stack layer connects with said capacitor contact;
   (e) etching said BPSG layer and said first doped polysilicon layer of said rectangular stack layer from the sidewall direction to leave a double T-shaped stack layer;
   (f) forming a second doped polysilicon layer on the upper surface and the sidewall of said double T-shaped stack layer;
   (g) anisotropically etching said second doped polysilicon layer to remove that portion formed on the upper surface and sidewall of said silicon oxy-nitride layer of said double T-shaped stack layer;

(h) removing said silicon oxy-nitride layer and said oxide layer of said double T-shaped stack layer by hydrogen fluoride to expose said second and first doped polysilicon layers to be used as the bottom electrode of capacitor; and (i) forming a dielectric layer and an upper electrode over said bottom electrode to form a capacitor.

12. A method for fabricating a capacitor as claimed in claim 11, wherein said first doped polysilicon layer has a thickness of somewhere between 1400 and 1600 Angstroms.

13. A method for fabricating a capacitor as claimed in claim 12, wherein said BPSG layer has a thickness of somewhere between 6000 and 8000 Angstroms.

14. A method for fabricating a capacitor as claimed in claim 13, wherein said silicon oxy-nitride layer has a thickness of somewhere between 500 and 700 Angstroms.

15. A method for fabricating a capacitor as claimed in claim 14, wherein said second doped polysilicon layer has a thickness of somewhere between 500 and 1100 Angstroms.

* * * * *